United States Patent
Chirila et al.

(10) Patent No.: US 9,837,565 B2
(45) Date of Patent: Dec. 5, 2017

(54) FABRICATING THIN-FILM OPTOELECTRONIC DEVICES WITH ADDED POTASSIUM

(71) Applicants: FLISOM AG, Duebendorf (CH); EMPA, Duebendorf (CH)

(72) Inventors: Adrian Chirila, Herznach (CH); Stephan Buecheler, Dachsberg (DE); Fabian Pianezzi, Altdorf (CH); Patrick Reinhard, Zurich (CH); Ayodhya Nath Tiwari, Meilen (CH)

(73) Assignees: FLISON AG, Duebendorf (CH); EMPA, Duebendorf (CH)

( * ) Notice: Subject to any disclaimer, the term of this patent is extended or adjusted under 35 U.S.C. 154(b) by 0 days.

(21) Appl. No.: 14/654,464

(22) PCT Filed: Dec. 16, 2013

(86) PCT No.: PCT/IB2013/060981
§ 371 (c)(1),
(2) Date: Jun. 19, 2015

(87) PCT Pub. No.: WO2014/097112
PCT Pub. Date: Jun. 26, 2014

(65) Prior Publication Data
US 2015/0333200 A1 Nov. 19, 2015

(30) Foreign Application Priority Data
Dec. 21, 2012 (WO) .................. PCT/IB2012/057605

(51) Int. Cl.
*H01L 31/0336* (2006.01)
*H01L 31/032* (2006.01)
(Continued)

(52) U.S. Cl.
CPC .......... *H01L 31/0323* (2013.01); *C23C 14/14* (2013.01); *C23C 14/24* (2013.01);
(Continued)

(58) Field of Classification Search
CPC ................. H01L 31/0323; H01L 31/18; H01L 21/02579; H01L 21/02422;
(Continued)

(56) References Cited

U.S. PATENT DOCUMENTS

| | | | |
|---|---|---|---|
| 4,332,880 A | 6/1982 | Izu et al. | |
| 4,961,829 A | 10/1990 | Mainzer et al. | |

(Continued)

FOREIGN PATENT DOCUMENTS

| | | |
|---|---|---|
| DE | 4442824 C1 | 1/1996 |
| DE | 10259258 A1 | 7/2004 |

(Continued)

OTHER PUBLICATIONS

Rudmann, D. (2004) Effects of sodium on growth and properties of Cu(In,Ga)Se2 thin films and solar cells, Doctoral dissertation, Swiss Federal Institute of Technology. Retrieved Sep. 17, 2012 from <URL: http://e-collection.ethbib.ethz.ch/eserv/eth:27376/eth-27376-02.pdf>.

(Continued)

*Primary Examiner* — Jayne Mershon
(74) *Attorney, Agent, or Firm* — Patterson & Sheridan, LLP.

(57) ABSTRACT

A method (200) and deposition zone apparatus (300) for fabricating thin-film optoelectronic devices (100), the method comprising: providing a potassium-nondiffusing substrate (110), forming a back-contact layer (120); forming at least one absorber layer (130) made of an ABC chalcogenide material, adding at least two different alkali metals, and forming at least one front-contact layer (150) wherein (Continued)

one of said at least two different alkali metals is potassium and where, following forming said front-contact layer, in the interval of layers (470) from back-contact layer (120), exclusive, to front-contact layer (150), inclusive, the comprised amounts resulting from adding at least two different alkali metals are, for potassium, in the range of 500 to 10000 ppm and, for the other of said at least two different alkali metals, in the range of 5 to 2000 ppm and at most ½ and at least ½₀₀₀ of the comprised amount of potassium. The method (200) and apparatus (300) are advantageous for more environmentally-friendly production of photovoltaic devices (100) on flexible substrates with high photovoltaic conversion efficiency and faster production rate.

21 Claims, 4 Drawing Sheets

(51) Int. Cl.
  *H01L 31/18* (2006.01)
  *C23C 14/24* (2006.01)
  *C23C 14/14* (2006.01)
  *H01L 21/02* (2006.01)

(52) U.S. Cl.
  CPC .. *H01L 21/02422* (2013.01); *H01L 21/02568* (2013.01); *H01L 21/02579* (2013.01); *H01L 21/02631* (2013.01); *H01L 31/18* (2013.01)

(58) Field of Classification Search
  CPC ... H01L 21/02568; H23C 14/24; H23C 14/14; H23C 21/02631
  USPC ........................................................ 136/265
  See application file for complete search history.

(56) References Cited

U.S. PATENT DOCUMENTS

| | | |
|---|---|---|
| 6,441,301 B1 | 8/2002 | Satoh et al. |
| 7,785,921 B1 | 8/2010 | Juliano et al. |
| 7,989,256 B2 | 8/2011 | Hakuma et al. |
| 8,193,028 B2 | 6/2012 | Lee |
| 8,415,557 B2 | 4/2013 | Fukunaga et al. |
| 2005/0202589 A1 | 9/2005 | Basol |
| 2006/0096635 A1 | 5/2006 | Tuttle |
| 2006/0145190 A1 | 7/2006 | Salzman |
| 2008/0012006 A1 | 1/2008 | Bailey |
| 2008/0023336 A1 | 1/2008 | Basol |
| 2008/0169025 A1 | 7/2008 | Basol |
| 2008/0210295 A1 | 9/2008 | Basol |
| 2009/0092744 A1 | 4/2009 | Pinarbasi |
| 2010/0258191 A1 | 10/2010 | Mackie |
| 2011/0177645 A1 | 7/2011 | Vasquez et al. |
| 2011/0186102 A1 | 8/2011 | Kobayashi et al. |
| 2012/0006395 A1 | 1/2012 | Boussaad et al. |
| 2012/0064352 A1 | 3/2012 | Boussaad et al. |
| 2012/0080091 A1 | 4/2012 | Min et al. |
| 2012/0132281 A1* | 5/2012 | Yang ............... H01L 31/0322 136/260 |
| 2012/0180870 A1* | 7/2012 | Yamamoto ......... H01L 31/0322 136/262 |
| 2012/0214293 A1 | 8/2012 | Aksu |
| 2012/0258567 A1* | 10/2012 | Aksu ............... H01L 21/02425 438/95 |
| 2012/0313200 A1 | 12/2012 | Jackrel et al. |
| 2013/0160831 A1 | 6/2013 | Zubeck et al. |

FOREIGN PATENT DOCUMENTS

| | | |
|---|---|---|
| EP | 0743686 A2 | 11/1996 |
| EP | 0826983 A1 | 3/1998 |
| EP | 0787354 B1 | 1/2003 |
| EP | 1291932 A2 | 3/2003 |
| EP | 2309548 A2 | 4/2011 |
| EP | 2339641 A2 | 6/2011 |
| EP | 2408023 A1 | 1/2012 |
| EP | 2463929 A1 | 6/2012 |
| WO | 2006076788 A1 | 7/2006 |
| WO | 2007072023 A1 | 6/2007 |
| WO | 2008088570 A1 | 7/2008 |
| WO | 2009076403 A1 | 6/2009 |
| WO | 2010/106534 A1 | 9/2010 |
| WO | 2011040645 A1 | 4/2011 |
| WO | 2012037242 A2 | 3/2012 |

OTHER PUBLICATIONS

Contreras et al. (1997) On the Role of Na and Modifications to Cu(In,Ga)Se2 Absorber Materials Using Thin-MF (M=Na, K, Cs) Precursor Layers, NREL/CP-520-22945.
Wuerz et al. (2011) CIGS thin-film solar cells and modules on enamelled steel substrates, Solar Energy Materials & Solar Cells 100 (2012) 132-137.
Chirila et al. (2011) Nature Materials 10,857-861.
Johnson et al. (2002) Interface Properties of CIGS(S)/Buffer Layers Formed by the Cd Partial Electrolyte Process, 29 th IEEE PVSC, May 20-24, 2002.
Xu et al. (2011) A novel one-step electrodeposition to prepare single-phase CuInS 2 thin films for solar cells, Solar Energy Materials & Solar Cells 95 (2011) 791-796.
Zhang et al. (2003) Formation of CuInSe 2 and Cu(In,Ga)Se 2 films by electrodeposition and vacuum annealing treatment, Solar Energy Materials & Solar Cells 80 (2003) 483-490.
International Search Report, PCT/IB2013/060981, dated Apr. 14, 2014.
Zribi, M. et al., "Optical Constants of Na-Doped CuInS2 Thin Films," Material Letters vol. 60, No. 1, Jan. 1, 2006, pp. 98-103.
Adrian Chirila, et al., "Potassium-Induced Surface Modification of Cu(In, Ga)Se2 Thin Films for High-Efficiency Solar Cells," Nature Materials, vol. 12. No. 12, Nov. 3, 2013, pp. 1107-1111.
Cojocaru-Miredin O., et al. "Exploring the P-N Junction Region Oin Cu(In,Ga) Sethin-Film Solar Cells at the Nanmeter-Scale," Applied Physics Letters, American Institute of Physics, US, vol. 101, No. 18, Oct. 29, 2012, pp. 181603-3.
Pyuck-Pa Choi, et al., "Compositional Gradients and Impurity Distributions in CuInSe2 Thin Film Solar Cells Studied by Atom Probe Tomography," Surface and Interface Analysis, vol. 44, No. 11-12, Nov. 18, 2012, pp. 1386-1388.
Hunger, R., et al, "Removal of the Surface Investion of CuInSe2 Absorbers by NH3, aq Etchings," Proceedings of the 3rd World Conference on Photovoltaic Energy Conversion: Joint Conference of 13th PV Science & Engineering Conference, 30th IEEE PV Specialists Conference, 18th European PV Solar Energy conference, May 18, 2003, pp. 556-569.
Balboul, M.R., et al., "Sodium Induced Phase Segregations in CuGaSe2 and CuInSe2 Thin Films," 17th E.G. Photovoltaic Solar Energy Conferenc, Munich Germany, Oct. 22-26, 2001; Proceedings of the International Photovoltaic Solar Energy Conference, Munich: WIP-Renewable Energies, DE vol. Conf. 17, Oct. 22, 2001, pp. 1015-1018.
Chinese Office Action dated Aug. 19, 2015 for Application No. 201280012915.3.
R. Wuerz et al. "CIGS Thin-Film Solar Cells and Modules on Enamelled Steel Substrates", Solar Energy Materials & Solar Cells. 2012.

* cited by examiner

FABRICATING THIN-FILM OPTOELECTRONIC DEVICES WITH ADDED POTASSIUM

CROSS-REFERENCE TO RELATED APPLICATIONS

This application is a 371 U.S. National Stage of International Application No. PCT/IB2012/060981, filed Dec. 16, 2013, and claims priority to International Patent Application No. PCT/IB2012/057605, filed Dec. 21, 2012, the disclosures of which are herein incorporated by reference in their entirety.

FIELD

The present invention relates to solar cells and/or optoelectronic devices manufactured by deposition of thin-films and more particularly to adding alkali metals when forming layers or the layer stack of optoelectronic devices comprising chalcogenide semiconductors or ABC semiconductive compounds.

BACKGROUND

Photovoltaic devices are generally understood as photovoltaic cells or photovoltaic modules. Photovoltaic modules ordinarily comprise arrays of interconnected photovoltaic cells.

A thin-film photovoltaic or optoelectronic device is ordinarily manufactured by depositing material layers onto a substrate. A thin-film photovoltaic device ordinarily comprises a substrate coated by a layer stack comprising a conductive layer stack, at least one absorber layer, optionally at least one buffer layer, and at least one transparent conductive layer stack.

The present invention is concerned with photovoltaic devices comprising an absorber layer generally based on an ABC chalcogenide material, such as an $ABC_2$ chalcopyrite material, wherein A represents elements in group 11 of the periodic table of chemical elements as defined by the International Union of Pure and Applied Chemistry including Cu or Ag, B represents elements in group 13 of the periodic table including In, Ga, or Al, and C represents elements in group 16 of the periodic table including S, Se, or Te. An example of an $ABC_2$ material is the $Cu(In,Ga)Se_2$ semiconductor also known as CIGS. The invention also concerns variations to the ordinary ternary ABC compositions, such as copper-indium-selenide or copper-gallium-selenide, in the form of quaternary, pentanary, or multinary materials such as compounds of copper-(indium, gallium)-(selenium, sulfur), copper-(indium, aluminium)-selenium, copper-(indium, aluminium)-(selenium, sulfur), copper-(zinc, tin)-selenium, copper-(zinc, tin)-(selenium, sulfur), (silver, copper)-(indium, gallium)-selenium, or (silver, copper)-(indium, gallium)-(selenium, sulfur).

The photovoltaic absorber layer of thin-film ABC or $ABC_2$ photovoltaic devices can be manufactured using a variety of methods such as chemical vapor deposition (CVD), physical vapor deposition (PVD), spraying, sintering, sputtering, printing, ion beam, or electroplating. The most common method is based on vapor deposition or co-evaporation within a vacuum chamber ordinarily using multiple evaporation sources. Historically derived from alkali material diffusion using soda lime glass substrates, the effect of adding alkali metals to enhance the efficiency of thin-film $ABC_2$ photovoltaic devices has been described in much prior art (Rudmann, D. (2004) Effects of sodium on growth and properties of $Cu(In,Ga)Se_2$ thin films and solar cells, Doctoral dissertation, Swiss Federal Institute of Technology. Retrieved 2012 Sep. 17 from <URL: http://e-collection.ethbib.ethz.ch/eserv/eth:27376/eth-27376-02.pdf>).

Much prior art in the field of thin-film $ABC_2$ photovoltaic devices mentions the benefits of adding alkali metals to increase photovoltaic conversion efficiency and, of the group of alkali metals comprising elements Li, Na, K, Rb, Cs, best results have been reported when diffusing sodium from precursor layers (see for example Contreras et al. (1997) On the Role of Na and Modifications to Cu(In,Ga) Se2 Absorber Materials Using Thin-MF (M=Na, K, Cs) Precursor Layers, NREL/CP-520-22945), or also EP0787354 by Bodegaard et al., or as well US20080023336 by Basol). More recent prior art provides data regarding diffusion of sodium and potassium from an enamelled substrate while also mentioning that potassium is known to dope CIGS in a similar way as sodium and hinders the interdiffusion of CIGS elements during growth of the absorber layer (Wuerz et al. (2011) CIGS thin-film solar cells and modules on enamelled steel substrates, Solar Energy Materials & Solar Cells 100 (2012) 132-137). Most detailed work has usually focused on adding or supplying sodium at various stages of the thin-film device's manufacturing process. Although often listed among other alkali metals, the beneficial effects of specifically adding, in a controlled manner, very substantial amounts of potassium, possibly in combination with some amount of sodium, has been insufficiently explored in prior art (see for example page 66 of Rudmann, D. (2004)). Section 4.2.2 of Rudmann, D. (2004) underlines a less pronounced beneficial effect of potassium in comparison to that of sodium. For reference, the highest photovoltaic conversion efficiency achieved in prior art for a photovoltaic cell on a polyimide substrate, i.e. on a potassium-nondiffusing substrate, with an $ABC_2$ absorber layer where sodium is added via physical vapor deposition of NaF, is about 18.7%, as reported in Chirila et al. (2011) Nature Materials 10, 857-861.

Prior art has so far not specifically disclosed how adding, in a controlled manner, substantial amounts of potassium to layers of thin-film $ABC_2$ photovoltaic devices can, especially in combination with sodium, enable the production of a class of photovoltaic devices with superior photovoltaic conversion efficiency. Prior art does not disclose how much potassium should be comprised within devices resulting from a controlled addition. In the field of manufacturing of flexible photovoltaic devices, there is a strong need for know-how regarding the controlled addition of alkali metals since some lightweight flexible substrates such as polyimide do not comprise the alkali metals known to passively diffuse out of rigid substrates such as soda-lime glass or enamelled substrates.

Furthermore, most prior art has assumed that sodium and potassium have similar effects on absorber layer and the optoelectronic device, such as doping, passivation of grain boundaries and defects, elemental interdiffusion, the resulting compositional gradients, and observed optoelectronic characteristics such as enhanced open circuit voltage and fill factor. This assumption has hindered inventiveness with respect to controlled addition of alkali metal combinations. This invention exploits previously unexplored properties of adding specific combinations of potassium and at least one other alkali metal, such as sodium, to a thin-film optoelectronic device, and especially to its absorber layer. The invention discloses independent control of separate alkali metals during adding to layers of the optoelectronic device.

Besides aforementioned effects such as doping, passivation of grain boundaries and defects, elemental interdiffusion, and observed optoelectronic characteristics such as enhanced open circuit voltage and fill factor, the invention's adding of alkali metals enables manufacturing of a thinner optimal buffer layer. This thinner optimal buffer layer results in reduced optical losses, thereby contributing to increase the device's photovoltaic conversion efficiency. This invention not only specifies a method to add potassium, but also the amount of potassium that should remain in the resulting thin-film device and, in the case sodium is also added, the ratio of potassium to sodium.

Finally, manufacturing of embodiments of photovoltaic devices on polyimide substrates according to the method, and at what a person skilled in the art would consider low and unfavorable temperatures, has resulted in a photovoltaic conversion efficiency that is greater, at filing date, than the highest ever certified using similar absorber layer technology but manufactured at the more favorable high temperature processes allowable by glass substrates. This suggests that the invention contributes a step that may overcome the need for high temperature processes or even benefit them too.

SUMMARY

This invention presents a solution to the problem of manufacturing high efficiency thin-film photovoltaic or optoelectronic devices that comprise an $ABC_2$ chalcopyrite absorber layer, especially flexible photovoltaic devices with said absorber layer, and more precisely devices manufactured onto substrates, such as polyimide, that do not comprise within the substrate alkali metals known to augment photovoltaic conversion efficiency.

The invention presents photovoltaic devices that comprise a proportionally large amount of potassium and describes the characteristics of said devices. The invention also presents a method for manufacturing said devices with the advantage of reduced optical losses and therefore enhanced photovoltaic conversion efficiency. The method is especially advantageous for the production of flexible photovoltaic devices based on plastic substrates. Devices manufactured according to said method have higher photovoltaic efficiency and possibly less unwanted material than equivalent devices manufactured using methods described in prior art.

A common problem in the field of thin-film photovoltaic devices relates to doping of the photovoltaic absorber layer for increased efficiency. When manufactured onto glass substrates or possibly onto substrates coated with materials comprising alkali metals, the substrate's alkali metals may diffuse into the absorber layer and increase photovoltaic conversion efficiency. In the case of substrates, such as polyimide, that do not comprise alkali metals, the alkali-doping elements must be supplied via deposition techniques such as, for example, physical vapor deposition. The alkali metals then diffuse during the deposition process within and across various thin-film layers and their interfaces.

Another problem in the field of thin-film photovoltaic devices lies at the interfaces between the absorber layer, the optional buffer layer, and the front-contact. The absorber layer's $ABC_2$ chalcopyrite crystals present substantial roughness that may require the deposition of a relatively thick buffer layer to ensure complete coverage of the absorber layer prior to deposition of the front-contact layer.

A further problem in the field of thin-film photovoltaic devices is that for some buffer layer compositions, the thicker the buffer layer, the lower its optical transmittance and therefore the lower the photovoltaic device's conversion efficiency.

Yet a further problem in the field of thin-film photovoltaic devices is that some buffer layer compositions, such as CdS, comprise the element cadmium, the quantity of which it is desirable to minimize.

Another problem in the field of thin-film photovoltaic device manufacturing is that the process for deposition of the buffer layer, such as chemical bath deposition (CBD), may generate waste. In the case of CdS buffer layer deposition the waste requires special treatment and it is therefore desirable to minimize its amount.

Yet another problem in the field of thin-film photovoltaic devices comprising a CdS buffer layer is that when the buffer layer thickness is less than about 40 nm, the photovoltaic device's fill factor and open circuit voltage are substantially lower than with photovoltaic devices having a buffer layer thickness greater than 40 nm.

Finally, yet another problem in the field of flexible thin-film photovoltaic device manufacturing is that it is desirable to benefit from large process windows for material deposition, and more specifically in relation to this invention, the process window for the adding of alkali metals and subsequent deposition of at least one buffer layer.

Briefly, the invention thus pertains to a method of fabricating thin-film photovoltaic devices comprising at least one $ABC_2$ chalcopyrite absorber layer and to adding very substantial amounts of potassium in combination with at least one other alkali metal. Said thin-film photovoltaic devices comprise—and we hereby define the term "potassium-nondiffusing substrate"—a substrate that is potassium-nondiffusing and/or comprises means, such as at least one barrier layer, that prevent diffusion of potassium from the substrate into at least said $ABC_2$ chalcopyrite absorber layer.

For the purposes of the present invention, the term "adding" or "added" refers to the process in which chemical elements, in the form of individual or compound chemical elements, namely alkali metals and their so-called precursors, are being provided in the steps for fabricating the layer stack of an optoelectronic device for any of:

forming a solid deposit where at least some of the provided chemical elements will diffuse into at least one layer of said layer stack, or simultaneously providing chemical elements to other chemical elements being deposited, thereby forming a layer that incorporates at least some of the provided chemical elements and the other elements, or depositing chemical elements onto a layer or layer stack, thereby contributing via diffusion at least some of the provided chemical elements to said layer or layer stack.

An advantageous effect of the invention is that the optimal thickness for an optional buffer layer coating said absorber layer is thinner than the optimal buffer layer needed for prior art photovoltaic devices with comparable photovoltaic efficiency. Another advantageous effect is that adding very substantial amounts of potassium in combination with at least one other alkali metal results in devices of higher photovoltaic conversion efficiency than if little or no potassium had been added. The invention contributes to shortening manufacturing process, reducing environmental impact of manufacturing and of the resulting device, and greater device photovoltaic conversion efficiency.

In greater detail, the method comprises providing a potassium-nondiffusing substrate, forming a back-contact layer, forming at least one absorber layer made of an ABC chalcogenide material, adding at least two different alkali metals, and forming at least one front-contact layer, wherein one of said at least two different alkali metals is potassium (K) and where, following forming said front-contact layer, in the interval of layers from back-contact layer, exclusive, to front-contact layer, inclusive, the comprised amounts resulting from adding at least two different alkali metals are, for potassium, in the range of 500 to 10000 ppm and, for the other of said at least two different alkali metals, in the range of 5 to 2000 ppm and at most ½ and at least 1/2000 of the comprised amount of potassium.

All quantities expressed herein as ppm are by the number of atoms of the alkali metal per million atoms in said interval of layers.

In said method, the comprised amount of potassium in said interval of layers may be kept in the range of 1000 to 2000 ppm. Furthermore, said at least one other alkali metal in said interval of layers may be Na, the amount of which is in the range of 5 to 500 ppm. More precisely, in said interval of layers the ppm ratio of K/Na may be in the range of 2 to 2000. A narrower range for K/Na may be from 10 to 100. In further detail, forming at least one absorber layer may comprise physical vapor deposition. Forming said absorber layer may comprise physical vapor deposition at substrate temperatures in the range of 100° C. to 500° C. Said absorber layer may be $Cu(In,Ga)Se_2$. In said method, adding of at least two different alkali metals may comprise separate adding any of said at least two different alkali metals. Furthermore, adding K may comprise adding KF. More precisely, after forming said at least one absorber layer, adding K may comprise physical vapor deposition of KF at a substrate temperature lower than 700° C. At a narrower temperature range, after forming said at least one absorber layer, adding K may comprise physical vapor deposition of KF at a substrate temperature in the range of 300° C. to 400° C. Furthermore, adding of at least one of said two different alkali metals may be done in the presence of at least one of said C element. In said method, adding at least two different alkali metals may comprise, at a substrate temperature in the range of 320 to 380° C. and after forming said absorber layer, a physical vapor deposition process comprising first adding NaF at a first deposition rate followed by adding KF at a second deposition rate. Said method may comprise forming at least one buffer layer at a step between forming absorber layer and forming front-contact layer. Furthermore, at least one buffer layer may comprise CdS. Forming of said buffer layer may comprise chemical bath deposition resulting in forming at least one buffer layer comprising CdS. Said buffer layer may have a thickness less than 60 nm. In said method, said substrate may be delivered between a delivery roll and a take-up roll of a roll-to-roll manufacturing apparatus. Said substrate may be polyimide.

The invention also pertains to a thin-film optoelectronic device obtainable by the described method, comprising: a potassium-nondiffusing substrate; a back-contact layer; at least one absorber layer, which absorber layer is made of an ABC chalcogenide material as previously described; and at least one front-contact layer, wherein the interval of layers from the back-contact layer, exclusive, to the front-contact layer, inclusive, comprises at least two different alkali metals, one of said at least two different alkali metals is potassium (K) with an amount in the range of 500 to 10000 ppm, and the comprised amount of the other of said at least two different alkali metals is in the range of 5 to 2000 ppm and is at most ½ and at least 1/2000 of the comprised amount of potassium. Said device may, when measured under standard test conditions (STC), have a characteristic open circuit voltage which is greater than 680 mV and a short circuit current density greater than 32 $mA/cm^2$.

Another aspect of the invention is a deposition zone apparatus for carrying out the described method for fabricating thin-film optoelectronic devices, comprising: means providing a potassium-nondiffusing substrate with a back-contact layer coating to said deposition zone apparatus; vapor deposition sources arranged for forming onto the back-contact layer coating side of said substrate at least one absorber layer made of an ABC chalcogenide material as previously described; and at least one further vapor deposition source arranged for adding at least one of two different alkali metals; wherein at least one of said at least two different alkali metals is potassium (K), the further evaporation deposition apparatus being configured such that following forming of at least one front-contact layer, in the interval of layers from the back-contact layer, exclusive, to the front-contact layer, inclusive, the comprised amounts resulting from adding at least two different alkali metals are, for potassium, in the range of 500 to 10000 ppm and, for the other of said at least two different alkali metals, in the range of 5 to 2000 ppm and at most ½ and at least 1/2000 of the comprised amount of potassium.

Advantages

The invention's features may advantageously solve several problems in the field of thin-film photovoltaic devices manufacturing, and more specifically manufacturing of the absorber and buffer layer of such devices based on a potassium-nondiffusing substrate. The listed advantages should not be considered as necessary for use of the invention. For manufacturing of thin-film flexible photovoltaic devices manufactured to the present invention, the advantages obtainable over devices and their manufacturing according to prior art include:
  Higher photovoltaic conversion efficiency,
  Thinner buffer layer,
  Faster deposition of buffer layer,
  Enlarged buffer layer deposition process window,
  Enlarged deposition process window for alkali metal doping elements,
  More environmentally-friendly manufacturing process and devices,
  Lower manufacturing costs.

BRIEF DESCRIPTION OF FIGURES

Embodiments of the invention will now be described by way of example, with reference to the accompanying drawings, in which.

DETAILED DESCRIPTION

In more detail, a "potassium-nondiffusing substrate" is a component, ordinarily a sheet of material, that comprises no potassium or so little potassium that diffusion of potassium elements into the subsequently described layers is considered too small to significantly alter the optoelectronic properties of the device. Potassium-nondiffusing substrates also include substrates that comprise means to prevent diffusion of potassium into coatings or layers supported by the substrate. A potassium-nondiffusing substrate may for example be a substrate that has been specially treated or coated with a barrier layer to prevent diffusion of potassium elements into coatings or layers supported by the substrate. Specially treated substrates or barrier-coated substrates ordinarily prevent the diffusion of a broad range of elements, including alkali metals, into coatings or layers supported by the substrate.

Figure 1:
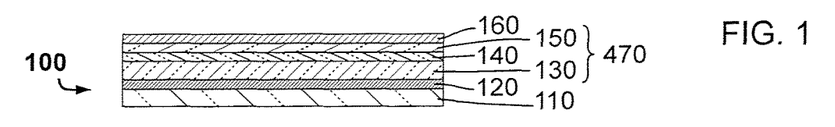
FIG. 1 is a cross-section of an embodiment of a thin-film optoelectronic device.

For clarity, components in figures showing embodiments are not drawn at the same scale. FIG. 1 presents the cross-section of an embodiment of a thin-film optoelectronic or photovoltaic device 100 comprising a potassium-nondiffusing substrate 110 for a stack of material layers wherein at least two different alkali metals, one of them being potassium, have been added.

Substrate 110 may be rigid or flexible and be of a variety of materials or coated materials such as glass, coated metal, plastic-coated metal, plastic, coated plastic such as metal-coated plastic, or flexible glass. A preferred flexible substrate material is polyimide as it is very flexible, sustains temperatures required to manufacture high efficiency optoelectronic devices, requires less processing than metal substrates, and exhibits thermal expansion coefficients that are compatible with those of material layers deposited upon it. Industrially available polyimide substrates are ordinarily available in thicknesses ranging from 7 μm to 150 μm. Polyimide substrates are ordinarily considered as potassium-nondiffusing.

At least one electrically conductive layer 120 coats substrate 110. Said electrically conductive layer, or stack of electrically conductive layers, also known as the back-contact, may be of a variety of electrically conductive materials, preferably having a coefficient of thermal expansion (CTE) that is close both to that of the said substrate 110 onto which it is deposited and to that of other materials that are to be subsequently deposited upon it. Conductive layer 120 preferably has a high optical reflectance and is commonly made of Mo although several other thin-film materials such as metal chalcogenides, molybdenum chalcogenides, molybdenum selenides (such as $MoSe_2$), Na-doped Mo, K-doped Mo, Na- and K-doped Mo, transition metal chalcogenides, tin-doped indium oxide (ITO), doped or non-doped indium oxides, doped or non-doped zinc oxides, zirconium nitrides, tin oxides, titanium nitrides, Ti, W, Ta, Au, Ag, Cu, and Nb may also be used or included advantageously.

At least one absorber layer 130 coats electrically conductive layer 120. Absorber layer 130 is made of an ABC material, wherein A represents elements in group 11 of the periodic table of chemical elements as defined by the International Union of Pure and Applied Chemistry including Cu or Ag, B represents elements in group 13 of the periodic table including In, Ga, or Al, and C represents elements in group 16 of the periodic table including S, Se, or Te. An example of an $ABC_2$ material is the $Cu(In,Ga)Se_2$ semiconductor also known as CIGS.

Optionally, at least one semiconductive buffer layer 140 coats absorber layer 130. Said buffer layer ordinarily has an energy bandgap higher than 1.5 eV and is for example made of CdS, Cd(S,OH), CdZnS, indium sulfides, zinc sulfides, gallium selenides, indium selenides, compounds of (indium, gallium)-sulfur, compounds of (indium, gallium)-selenium, tin oxides, zinc oxides, Zn(Mg,O)S, Zn(O,S) material, or variations thereof.

At least one transparent conductive layer 150 coats buffer layer 140. Said transparent conductive layer, also known as the front-contact, ordinarily comprises a transparent conductive oxide (TCO) layer, for example made of doped or non-doped variations of materials such as indium oxides, tin oxides, or zinc oxides.

Contributing to this invention, the amount of potassium comprised in the interval of layers 470 from electrically conductive back-contact layer 120, exclusive, to transparent conductive front-contact layer 150, inclusive, is in the range between 500 and 10000 potassium atoms per million atoms (ppm) and the amount of the other of said at least two different alkali metals is in the range of 5 to 2000 ppm and at most ½ and at least 1/2000 of the comprised amount of potassium. A thin-film photovoltaic device demonstrating superior photovoltaic conversion efficiency preferably has an amount of potassium comprised in said interval of layers 470 in the range between 1000 and 2000 potassium atoms per million atoms.

Optionally, front-contact metallized grid patterns 160 may cover part of transparent conductive layer 150 to advantageously augment front-contact conductivity. Also optionally, said thin-film photovoltaic device may be coated with at least one anti-reflective coating such as a thin material layer or an encapsulating film.

Figure 2:
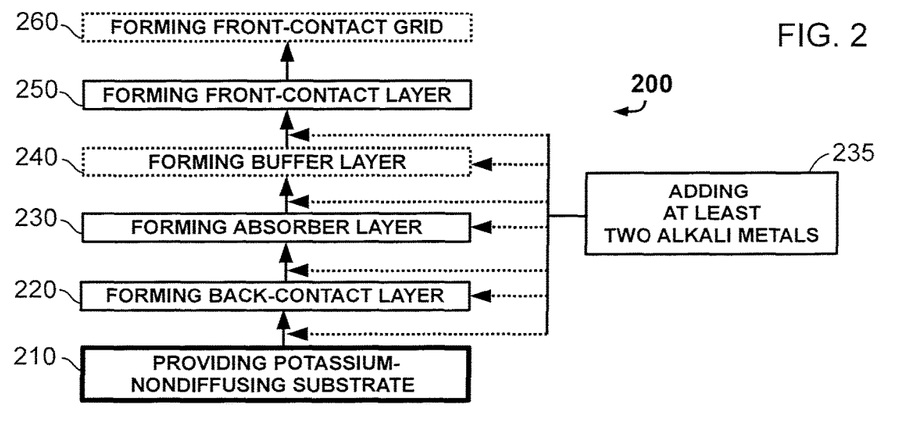
FIG. 2 presents steps in a method to manufacture a thin-film optoelectronic device.

FIG. 2 presents a method 200 comprising material deposition steps to manufacture said thin-film optoelectronic or photovoltaic device 100 comprising a potassium-nondiffusing substrate 110 for a stack of material layers where at least two different alkali metals, one of them being potassium, have been added. The method is considered to be especially appropriate for substrates considered potassium-nondiffusing or that may comprise at least one barrier layer that prevents the diffusion of alkali metals from the substrate into subsequently deposited coatings. The method as described is especially advantageous for plastic substrate materials such as polyimide.

An exemplary sequence of material layer deposition follows. The purpose of this description is to clarify the context within which adding of alkali metals 235, the main subject of this invention, occurs.

The method starts at step 210 by providing a potassium-nondiffusing substrate. Said substrate is considered as potassium-nondiffusing, according to the description provided for substrate 110.

Following step 210 and until the step of forming front-contact layer 250, adding of at least two different alkali metals 235, one of them being potassium, occurs as at least one event during and/or between any of steps comprised in the interval from step 210, exclusive, to step 250, exclusive. The fact that the adding may occur during or between said interval of steps is represented by dashed arrows emanating from block 235 in FIG. 2. Each of said alkali metals may be added simultaneously with any of the other of said alkali metals and/or during separate adding events. Adding of each of said alkali metals may comprise any or a combination of adding a layer or precursor layer of at least one of the alkali metals, co-adding at least one of the alkali metals with the forming of any of the method's material layers, or diffusing at least one of the alkali metals from at least one layer into at least one other material layer. Preferably, adding of at least one of said two different alkali metals is done in the presence of at least one said C element. More preferably, adding of potassium, for example by adding via a so-called potassium-comprising precursor such as KF, KCl, KBr, KI, $K_2S$, $K_2Se$, is done in the presence of at least one said C element.

At step 220, forming at least one back-contact layer comprises depositing at least one electrically conductive layer. Forming of the back-contact layer may be done using a process such as sputtering, spraying, sintering, electrodeposition, CVD, PVD, electron beam evaporation, or spraying of the materials listed in the description of said electrically conductive layer 120.

At step 230, forming at least one absorber layer comprises coating said electrically conductive layer with at least one ABC absorber layer 130. The materials used correspond to those in the description provided for ABC absorber layer 130. Said absorber layer may be deposited using a variety of techniques such as sputtering, spraying, sintering, CVD, electrodeposition, printing, or as a preferred technique for an ABC material, physical vapor deposition. Substrate temperatures during absorber layer deposition are ordinarily comprised between 100° C. and 650° C. The range of temperatures and temperature change profiles depend on several parameters including at least the substrate's material properties, the supply rates of the materials that compose the ABC material, and the type of coating process. For example, for a vapor deposition process, substrate temperatures during forming of the absorber layer will ordinarily be below 600° C., and if using substrates requiring lower temperatures, such as a polyimide substrate, preferably below 500° C., and more preferably in the range from 100° C. to 500° C. For a co-evaporation vapor deposition process, substrate temperatures during forming of the absorber layer will ordinarily be in the range from 100° C. to 500° C. Said substrate temperatures may be advantageously used with a polyimide substrate.

For a deposition process such as physical vapor deposition, for example if forming absorber layer 230 is done using a physical vapor deposition process, adding of potassium as part of adding at least two different alkali metals 235 may be done during and/or in continuation of the physical vapor deposition process by supplying potassium fluoride, KF. This may for example be advantageous when manufacturing with a co-evaporation physical vapor deposition system. Adding the alkali metal potassium will preferably be done in the presence of a flux of element Se supplied at a rate in the range of 5 to 100 Å/s, preferably at a rate in the range of 20 to 50 Å/s.

Substrate temperatures for said adding of at least two different alkali metals will ordinarily be greater than 100° C. and less than 700° C. Substrate temperatures will preferably be greater than 300° C. and less than 400° C. A person skilled in the art will select appropriate temperatures for said adding of at least two different alkali metals so that they are compatible with the materials deposited, thin-film properties, and substrate. For example, one skilled in the art of physical vapor deposition processes will know that potassium, for example in the form of KF, may be added at higher temperatures than some other alkali metals such as sodium, for example in the form of NaF. The possibility of higher adding temperature for KF may advantageously be used to add alkali metals starting with potassium at temperatures closer to those used at step 230 and, as the substrate temperature decreases, to continue with adding of same and/or other alkali metals. A person skilled in the art will also know that adding of at least two different alkali metals may take place with adding of one or more of said at least two different alkali metals at substrate temperatures ordinarily lower than 700° C. and possibly much lower than 350° C., such as at ambient temperatures of about 25° C. and below. The substrate may then be heated afterwards, thereby facilitating diffusing of said alkali metals to the thin-film layers of the optoelectronic device, possibly in combination with depositing at least one C element.

The amount of potassium added by adding at least two alkali metals 235 is such that following forming of front-contact layer 150 at later step 250, said amount comprised in the interval of layers 470 from back-contact layer 120, exclusive, to front-contact layer 150, inclusive, is in the range between 500 and 10000 potassium atoms per million atoms and the amount of the other of said at least two different alkali metals is in the range of 5 to 2000 ppm and at most ½ and at least 1/2000 of the comprised amount of potassium. A thin-film photovoltaic device that has a superior photovoltaic conversion efficiency preferably has an amount comprised in said interval of layers 470 from about 1000 to 2000 potassium atoms per million atoms.

The following steps describe how to complete the manufacture of a working photovoltaic device benefiting of the invention.

At step 240, represented as a dashed box because the step may be considered optional, forming buffer layer comprises coating said absorber layer with at least one so-called semiconductive buffer layer 140. The materials used correspond to those in the description provided for buffer layer 140. Said buffer layer may be deposited using a variety of techniques such as CVD, PVD, sputtering, sintering, electrodeposition, printing, atomic layer deposition, or as a well known technique at atmospheric pressure, chemical bath deposition. Forming of said buffer layer is preferably followed by an annealing process, ordinarily in air or possibly within an atmosphere with controlled composition or even in vacuum, at between 100° C. and 300° C. for a duration of 1 to 30 minutes, preferably 180° C. for a duration of 2 minutes.

To tune the process of forming the buffer layer of step 240, one skilled in the art will ordinarily develop a test suite over a range of buffer coating process durations to manufacture a range of photovoltaic devices comprising a range of buffer layer thicknesses. One will then select the buffer coating process duration that results in highest photovoltaic device efficiency. Furthermore, for the purpose of manufacturing reference devices to be considered as corresponding to prior art devices, one will prepare a range of photovoltaic devices where the step of adding at least two alkali metals 235 comprises alkali metals but does not comprise the amount of potassium specified in this invention and a lesser amount of the other alkali metal. Said prior art devices will be coated with said range of buffer layer thicknesses. By comparing said prior art devices with devices manufactured according to the invention, one skilled in the art will notice that the latter have substantially higher photovoltaic conversion efficiency.

At step 250, forming front-contact layer comprises coating said buffer layer with at least one transparent conductive front-contact layer 150. Said front-contact layer ordinarily comprises a transparent conductive oxide (TCO) layer, for example made of doped or non-doped variations of materials such as indium oxide, gallium oxide, tin oxide, or zinc oxide that may be coated using a variety of techniques such as PVD, CVD, sputtering, spraying, CBD, electrodeposition, or atomic layer deposition.

At optional step 260, forming front-contact grid comprises depositing front-contact metallized grid traces 160 onto part of transparent conductive layer 150. Also optionally, said thin-film photovoltaic device may be coated with at least one anti-reflective coating such as a thin material layer or an encapsulating film.

The steps may also comprise operations to delineate cell or module components. In the context of superstrate-based manufacturing, the order of the method's manufacturing sequence may be partly reversed in the order comprising forming optional front-contact grid 260, forming front-contact layer 250, forming optional buffer layer 240, forming absorber layer 230, adding at least two alkali metals 235, and forming an electrically conductive back-contact layer.

Figure 3:
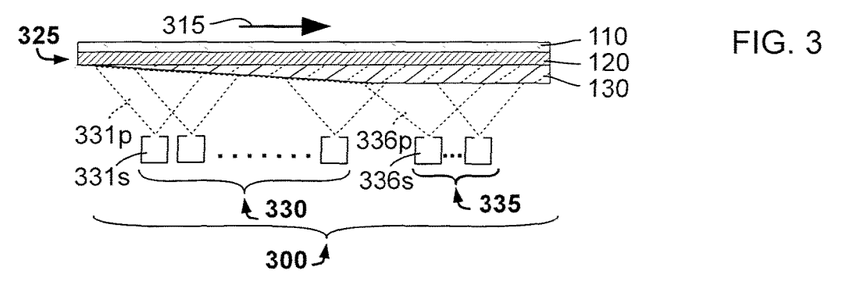
FIG. 3 is a side cross-section of a vapor deposition zone of an apparatus for manufacturing a thin-film optoelectronic device.

FIG. 3 shows a side cross-section of a deposition zone apparatus 300 comprised in a section of an apparatus for manufacturing a thin-film optoelectronic or photovoltaic device comprising a potassium-nondiffusing substrate 110 for a stack of material layers wherein at least two different alkali metals, one of them being potassium, are being added. Deposition zone apparatus 300 is ordinarily comprised inside a vacuum deposition chamber for manufacturing at least the absorber layer of photovoltaic modules. An object to be coated, such as a flat panel or a flexible web, thereafter called web 325, enters deposition zone apparatus 300, travels according to direction 315 over a set of sources for forming at least one absorber layer 330 and at least one set of sources for adding at least two different alkali metals 335, and then exits deposition zone apparatus 300.

Web 325 comprises a substrate 110 coated with an electrically conductive back-contact layer, or stack of electrically conductive layers, thereafter called back-contact layer 120. Said substrate, prior to being coated with said stack of electrically conductive layers, is considered as potassium-nondiffusing. For more economical roll-to-roll manufacturing, said substrate is preferably of a flexible material such as coated metal, plastic-coated metal, plastic, coated plastic such as metal-coated plastic, or metal-coated flexible glass. A preferred web polyimide coated with a conductive metal back-contact, where said back-contact layer is preferably Mo although several other thin-film materials such as non-doped, Na-doped, K-doped, Sn-doped variations of materials such as metal chalcogenides, molybdenum chalcogenides, molybdenum selenides (such as $MoSe_2$), Mo, transition metal chalcogenides, indium oxide (ITO), indium oxides (such as $In_2O_3$), zinc oxides, zirconium nitrides, tin oxides, titanium nitrides, Ti, Cu, Ag, Au, W, Ta, and Nb may also be used or included.

The set of absorber deposition sources 330 comprises a plurality of sources 331s generating effusion plumes 331p that, in the case of a preferable co-evaporation setup, may overlap. Said set of absorber deposition sources 330 provides the materials to coat web 325 with at least one absorber layer 130 of ABC material.

In this description, a vapor deposition source, or source, is any device conveying material vapor for deposition onto a layer. The vapor may result from melting, evaporating, or sublimating materials to be evaporated. The device generating the vapor may be at a position that is remote from the substrate, for example providing the vapor via a duct, or near the substrate, for example providing the vapor through nozzles or slit openings of a crucible.

The set of sources for adding at least two different alkali metals 335 comprises at least one source 336s generating effusion plume 336p adding at least one of two different alkali metals to at least one of the layers of the device prior to it bearing a front-contact. Adding of said alkali metals is preferably done to said absorber layer 130. At least one source 336s comprises potassium, preferably in the form of potassium fluoride KF. Preferably at least one source 336s comprises sodium, preferably in the form of sodium fluoride NaF. Sources 336s may provide other alkali metals, preferably as a co-evaporation setup, and effusion plumes 336p may overlap at least one of effusion plumes 331p. If the set of said sources for adding alkali metals 335 comprises more than one source 336s, the source comprising potassium may be positioned such that its material is added before, at the same time, or after other alkali metals. Furthermore, said apparatus preferably comprises means to provide at least one C element within at least the part of said deposition zone where adding of potassium occurs.

The amount of potassium added by the sources for adding at least two different alkali metals 335 is such that, following forming of transparent front-contact layer 150, said amount comprised in the interval of layers 470 from back-contact layer 120, exclusive, to front-contact layer 150, inclusive, is in the range of 500 to 10000 potassium atoms per million atoms and, for the other of said at least two different alkali metals, in the range 5 to 2000 ppm and at most ½ and at least 1/2000 the comprised amount of potassium. A thin-film photovoltaic device that has a superior photovoltaic conversion efficiency preferably has an amount comprised in said interval of layers 470 from about 1000 to 2000 potassium atoms per million atoms.

The location for forming front-contact layer 150 is considered to be outside said deposition zone apparatus 300 and the means for forming said front-contact layer are therefore not represented.

FIGS. 4 to 8 present characterization data for a set of exemplary photovoltaic device embodiments manufactured according to the method. Said devices comprise a GIGS absorber layer 130 and are subjected to adding at least two different alkali metals 235. Said absorber layer of each exemplary device is subjected to a chemical bath deposition (CBD) for forming a CdS buffer layer 240. Said CBD's have different durations so as to generate different buffer layer thicknesses and enable determination of the thickness of the buffer layer 140 that maximizes photovoltaic conversion efficiency. FIGS. 4 to 8 disclose that devices manufactured according to the invention may have a higher efficiency and/or a thinner buffer layer than devices of prior art.

Figure 4:
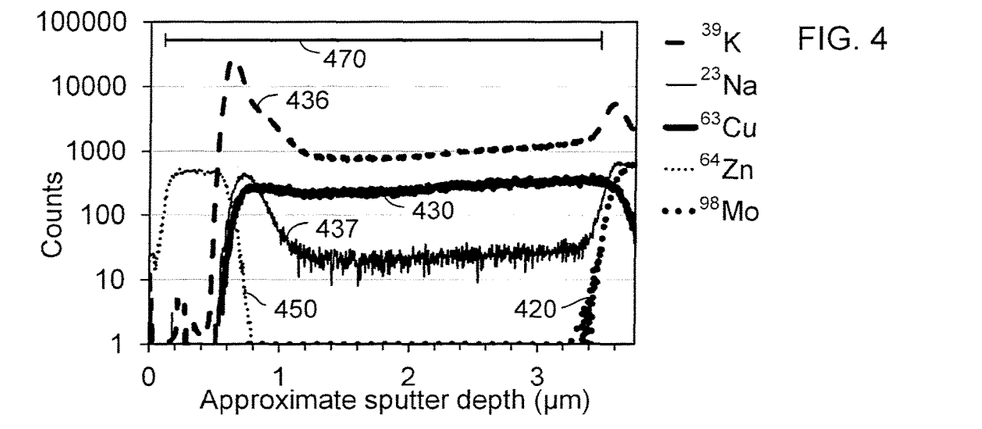
FIG. 4 is a sputter depth profiling graph obtained using second ion mass spectrometry (SIMS).

FIG. 4 is a sputter depth profiling graph plotting the counts of various elements within the optoelectronic device versus approximate sputter depth. The at least two different alkali metals plotted are potassium 436 and sodium 437. The graph also presents data for copper 430, representative of the absorber layer, of zinc 450, representative of the front-contact layer, and of molybdenum 420, representative of the back-contact layer. The graph shows that, at a given depth, the counts of potassium may be over an order of magnitude greater than the counts of sodium. Interval of layers 470 from back-contact layer 120, exclusive, to front-contact layer 150, inclusive, is measured from the log-scale plot's half-height of shallowest maximum of back-contact layer to half-height of shallowest maximum of front-contact layer, respectively. The sputter depth profiling graph was obtained using second ion mass spectrometry (SIMS). Depth profiling data were obtained with a SIMS system using $O_2^+$ primary ions with 2 kV ion energy, 400 nA, and 300×300 µm² spot. The analyzed area was 100×100 µm² using $Bi_1^+$ with 25 kV ion energy.

Figure 5A:
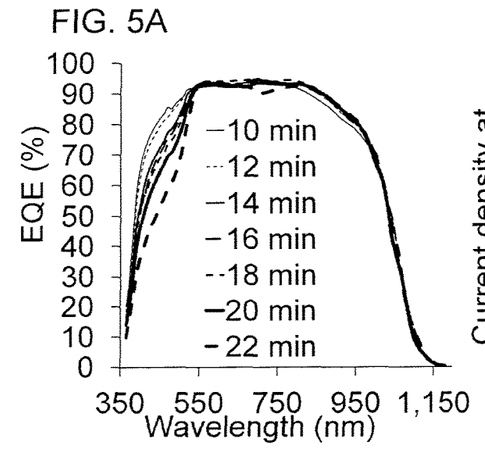
FIGS. 5A and 5B are graphs related to measurements of photovoltaic device external quantum efficiency for a set of photovoltaic devices.
Figure 5B:
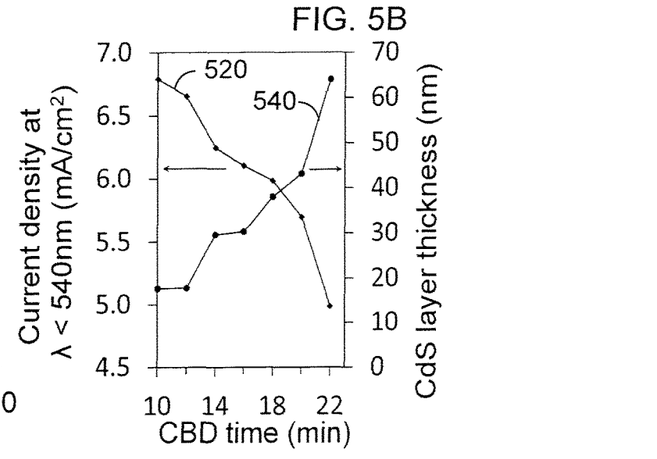

FIGS. 5A and 5B relate to measurements of photovoltaic device external quantum efficiency (EQE) as a function of illumination wavelength. These measurements are useful for tuning the buffer layer coating process to maximize photovoltaic conversion efficiency when manufacturing photovoltaic devices.

FIG. 5A presents plots of EQE vs. illumination wavelength for a range of photovoltaic devices, each device having a different buffer layer thickness. EQE measurements enable calculation of current density. Buffer layer thickness increases with the duration of the step of forming the buffer layer. In FIG. 5A, durations of the step of forming the buffer layer range from 10 minutes to 22 minutes in 2 minute increments. Lines for 20 min and 22 min durations of the step of forming the buffer layer correspond to buffer layer thicknesses ordinarily used in prior art photovoltaic devices, such as in Chirila (2011).

FIG. 5B presents plots of current density 520 and buffer layer thickness 540 as a function of the duration of forming a CdS buffer layer. Data for current density 520 are derived from EQE measurements presented in FIG. 5A obtained with an exemplary embodiment of a photovoltaic cell device manufactured according to the invention and illuminated at wavelengths less than 540 nm under standard test conditions (STC). Current density data is used for subsequent computation of photovoltaic conversion efficiency. FIG. 5B also presents measurements of CdS buffer layer thickness 540 as a function of chemical bath deposition (CBD) duration for forming said buffer layer. Data of FIG. 5B is useful in combination with FIGS. 6A-6H, 7A, 7B to illustrate that the main advantageous effect of highest photovoltaic conversion efficiency results from adding at least two different alkali metals, at least one of which is potassium in substantially large amounts according to the invention, in combination with forming a buffer layer of optimal thickness, said buffer layer being substantially thinner than buffer layers ordinarily used in photovoltaic devices manufactured according to prior art. For example, highest efficiency photovoltaic devices manufactured using CBD for forming a CdS buffer layer have a buffer layer thickness greater than about 20 nm and less than about 30 nm.

Measurement of buffer layer thickness was done using inductively coupled plasma mass spectrometry (ICPMS). For ICPMS analysis approximately 1 cm² of material was detached from the thin-film solar cell at the Mo back-contact/absorber layer interface. The solid matter was directly transferred into 50 mL trace metal free polyethylene tubes and fully dissolved in a mixture of 10 mL HNO3 (65% w/w) and 1 mL HCl (32% w/w). After filling to 50 mL with 18 MΩ·cm deionized water, the sample was not further diluted for analysis. Metal analysis was performed on an inductively coupled plasma mass spectrometer with external calibration using certified metal standards (1000 µg/mL). The CdS buffer layer thicknesses are derived from atomic concentrations measured by ICPMS assuming that all measured Cd atoms are incorporated within a perfectly flat CdS layer with a density of 4.82 g/cm³, and neglecting in-diffusion of Cd atoms into the absorber layer. Because some Cd in-diffusion into the absorber layer is occurring and the CdS layer is formed onto an absorber layer with a certain roughness, the actual CdS layer thickness is overestimated by this measurement technique by up to 100% depending on said surface roughness and the extent of Cd in-diffusion. Therefore, the thickness determination by ICPMS provides an upper value for the actual CdS buffer layer thickness. More precise determination can be made by more expensive techniques such as for example transmission electron microscopy (TEM).

FIGS. 6A to 6H present data ordinarily used to characterize photovoltaic devices and enable in FIGS. 6A to 6D a comparison between durations of chemical bath depositions for forming the CdS buffer layer and in FIGS. 6E to 6H a comparison between durations of potassium fluoride (KF) supply after forming of the absorber layer. Standard deviations over a set of photovoltaic device embodiments are indicated by vertical bars. Note that the deposition or supply durations presented are those used to manufacture a prototype device embodiment using laboratory-scale equipment. A person skilled in the art will infer that shorter durations may be obtained with industrial-level equipment. The data presented illustrates how to select the deposition or supply duration that provides highest photovoltaic conversion efficiency.

Figure 6A:
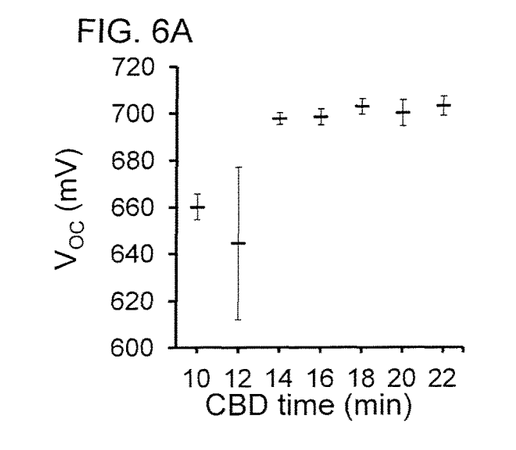
FIGS. 6A-6H are graphs enabling comparison of durations for forming a CdS buffer layer and for adding potassium fluoride.

FIG. 6A is a graph of open circuit voltage $V_{OC}$ as a function of the duration of the chemical bath deposition for forming the buffer layer. The graph shows that $V_{OC}$ is about constant for durations ranging from about 14 to 22 minutes which, compared to plot 540 in FIG. 5B, corresponds to a buffer layer thickness ranging from about 30 nm to 65 nm.

Figure 6B:
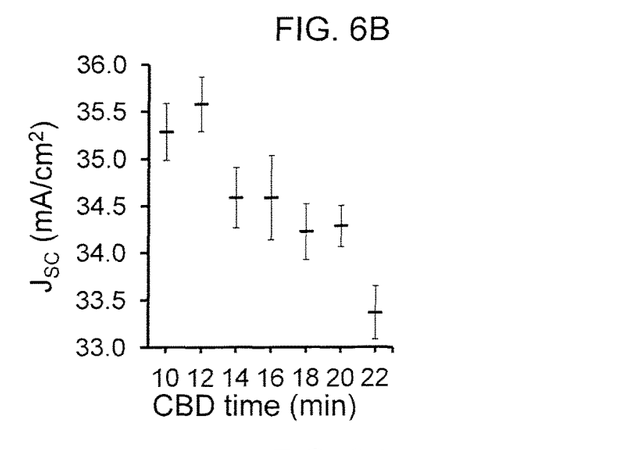

FIG. 6B is a graph of current density $J_{SC}$ as a function of the duration of the chemical bath deposition for forming the buffer layer. The graph shows that $J_{SC}$ decreases for increasing deposition durations ranging from about 14 to 22 minutes which, compared to plot 540 in FIG. 5B, corresponds to a buffer layer thickness ranging from about 18 nm to 65 nm.

Figure 6C:
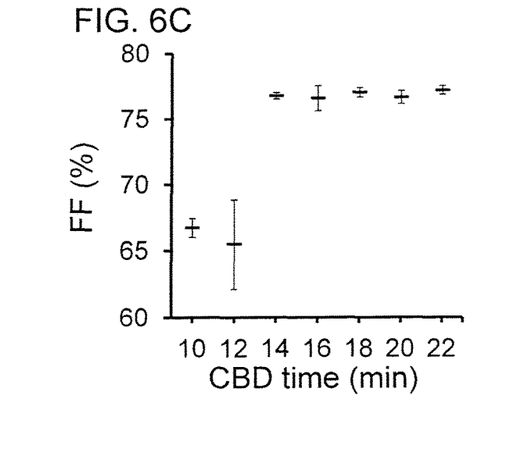

FIG. 6C is a graph of fill factor FF as a function of the duration of the chemical bath deposition for forming the buffer layer. The graph shows that FF is about constant for deposition durations ranging from about 14 to 22 minutes.

Figure 6D:
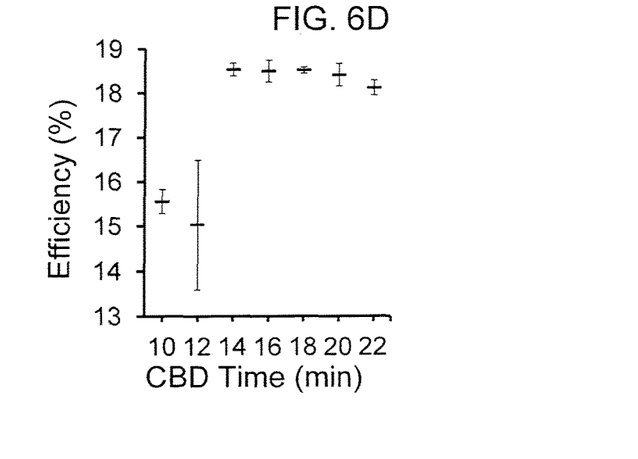
Figure 6E:
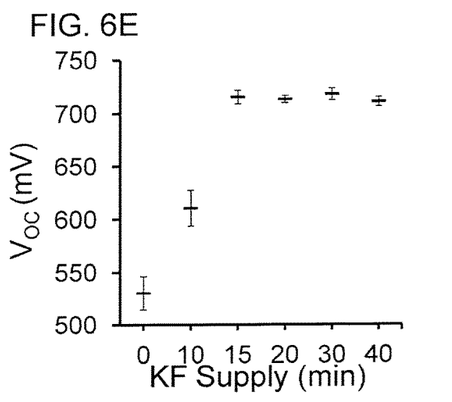
Figure 6F:
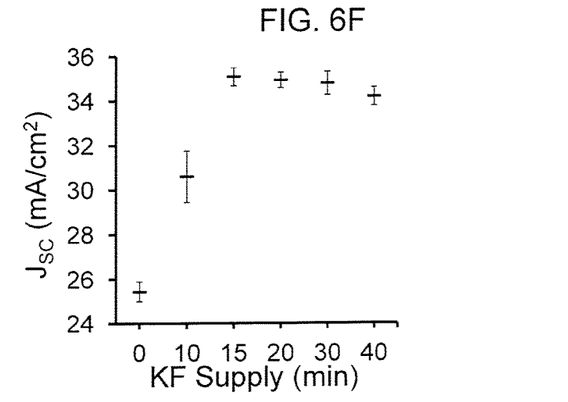
Figure 6G:
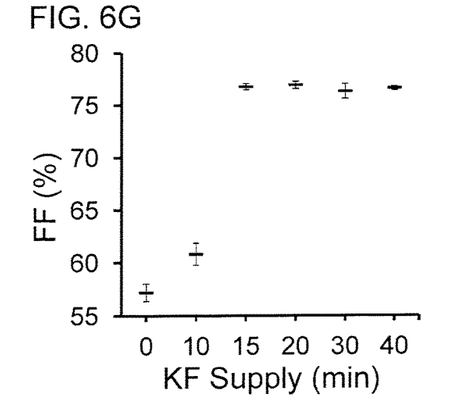
Figure 6H:
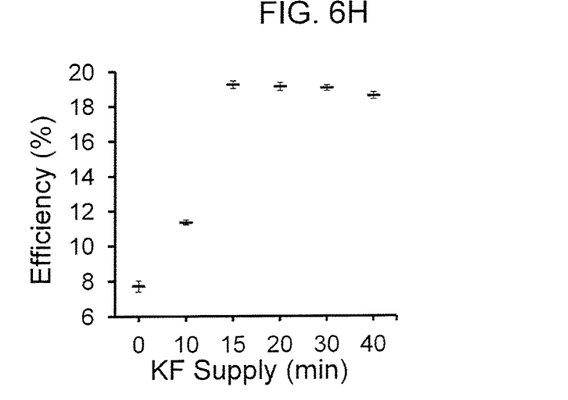

FIG. 6D is a graph of photovoltaic conversion efficiency as a function of the duration of the chemical bath deposition for forming the buffer layer. The graph shows that photovoltaic conversion efficiency is maximum for a deposition duration of 14 minutes which, compared to plot 540 in FIG. 5B, corresponds to a buffer layer thickness of about 30 nm. Photovoltaic devices manufactured according to prior art ordinarily exhibit highest photovoltaic conversion efficiency with a CdS buffer layer thicker than 40 nm. Photovoltaic devices manufactured according to the present invention therefore exhibit the advantageous effects of having both higher photovoltaic conversion efficiency and thinner buffer layer than prior art.

FIGS. 6E to 6H are graphs of open circuit voltage $V_{OC}$, current density $J_{SC}$, fill factor FF, and photovoltaic conversion efficiency, respectively, as a function of the duration of potassium fluoride supply as a PVD process for adding potassium after forming the absorber layer. All devices were subjected to a 14 minutes CBD providing them with a buffer layer that is about 30 nm. FIGS. 6E to 6H respectively show that $V_{OC}$, $J_{SC}$, FF, and photovoltaic conversion efficiency reach a maximum at about 15 minutes of KF supply. The values remain about constant for durations ranging from about 15 to 40 minutes.

Figure 7A:
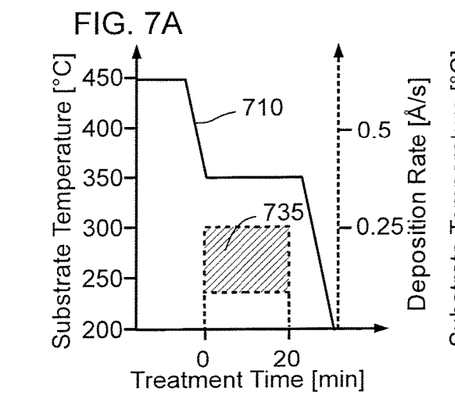
FIGS. 7A and 7B are graphs of deposition temperatures and rates for adding at least two different alkali metals, one of which is potassium.
Figure 7B:
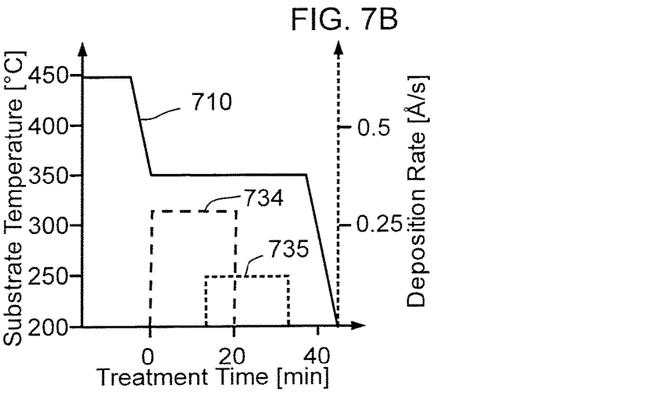

FIGS. 7A and 7B present exemplary substrate temperature 710 and supply rate 734, 735 as a function of time during said adding of at least two different alkali metals. In this example of manufacturing a photovoltaic device on a polyimide substrate, the substrate temperature 710 decreases from the about 450° C. used for said forming of the absorber layer to the about 350° C. used for adding of at least two different alkali metals. Note that the supply durations and rates 734, 735 presented are those used to manufacture a prototype device using laboratory scale equipment. A person skilled in the art will infer that shorter durations and greater supply rates 734, 735 may be obtained with industrial-level equipment.

In the example of FIG. 7A the adding of at least two different alkali metals uses a physical vapor deposition process where alkali metal potassium, for example in the form of KF potassium-comprising precursor 735, is supplied at a rate equivalent to an effective layer deposition ranging from about 0.08 Å/s to 0.25 Å/s, preferably 0.125 Å/s, for a duration of 20 minutes. Adding at least two alkali metals 235 is done in the presence of Se. Adding of at least one other alkali metal is not represented in FIG. 7A as it may, for example, be added prior to or during forming of the absorber layer.

In the example of FIG. 7B the adding of at least two different alkali metals uses a physical vapor deposition process where sodium, for example in the form of NaF sodium-comprising precursor 734, is first added at a rate of about 0.3 Å/s for a duration of 20 minutes and followed, possibly as part of a co-evaporation process, by adding of potassium, for example in the form of KF potassium-comprising precursor 735, at a rate of about 0.125 Å/s for a duration of 20 minutes. At least one adding of at least two different alkali metals is done in the presence of Se.

Figure 8A:
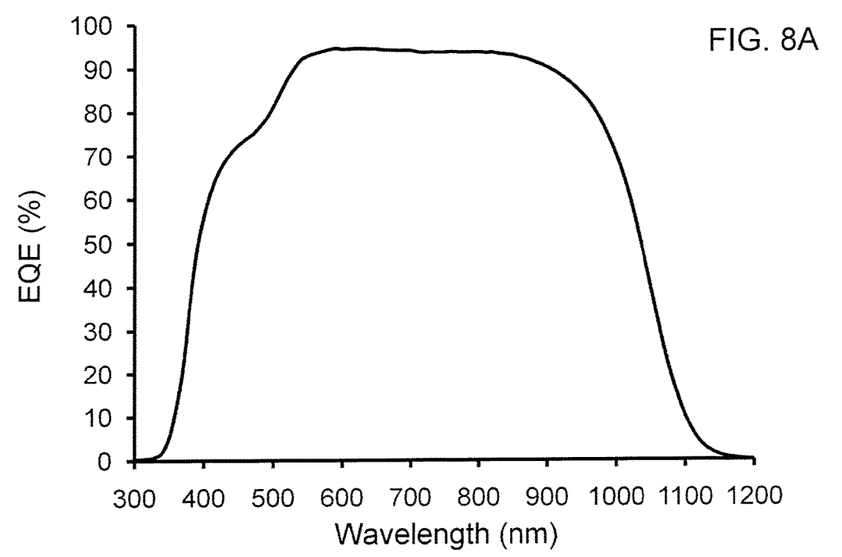
FIGS. 8A-8B present external quantum efficiency vs. wavelength and current density vs. voltage for a photovoltaic device embodiment with 20.4% photovoltaic conversion efficiency.
Figure 8B:
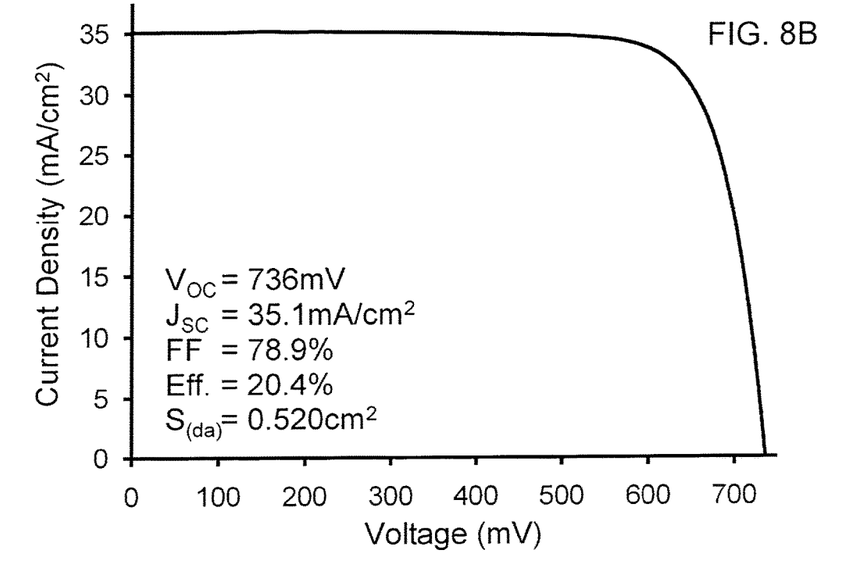

FIGS. 8A and 8B respectively present EQE as a function of illumination wavelength and current density as a function of voltage for an exemplary embodiment of an optoelectronic device with high photovoltaic conversion efficiency manufactured according to the invention. Said device comprises a polyimide substrate and, between back- and front-contacts, a CIGS absorber layer subjected to adding at least K in the amounts in the range of 1400 to 1600 ppm and Na in the amounts in the range of 10 to 100 ppm, and a buffer layer. The device's officially certified photovoltaic efficiency is 20.4%. The device's open circuit voltage and short circuit current under standard test conditions (STC) was measured at 736 mV and 35.1 mA/cm$^2$, respectively. The fill factor is 78.9%.

The chemical bath deposition used for forming said buffer layer was carried out using a mixture of high purity water (18 MΩ·cm) and $1.8 \times 10^{-3}$M $Cd(CH_3COO)_2$, 0.024M $SC(NH_2)_2$, and 1.77M $NH_3$ solution. The sample is immersed into the solution which is subsequently placed into a water bath that is heated to 70° C. Agitation is carried out with a magnetic stirrer. CdS buffer layer thicknesses of about 20-30 nm were obtained with deposition times of about 13-17 min.

The invention claimed is:

1. A method of fabricating thin-film optoelectronic devices, comprising:
    forming a back-contact layer over a substrate;
    forming an absorber layer over the back-contact layer, wherein the absorber layer comprises a chalcogenide material;
    adding at least two different alkali metals to the absorber layer;
    forming a buffer layer comprising potassium (K) over the absorber layer; and
    forming a front-contact layer over the buffer layer, wherein one of the at least two different alkali metals added to the absorber layer comprises a first alkali metal comprising potassium (K).

2. The method according to claim 1, wherein in the absorber layer comprises a plurality of absorber films that each comprise an amount of potassium in a range of 1000 to 2000 ppm.

3. The method according to claim 1, wherein the at least two different alkali metals further comprise a second alkali metal that comprises sodium (Na) that has a concentration in the absorber layer in a range of 5 to 500 ppm.

4. The method according to claim 3, wherein an atomic ratio of K/Na in the absorber layer is in a range of 2 to 2000.

5. The method according to claim 4, wherein the atomic ratio of K/Na in the absorber layer is in a range of 10 to 100.

6. The method according to claim 1, wherein forming the absorber layer comprises depositing the absorber layer using a physical vapor deposition process at a substrate temperature in a range of 100° C. to 500° C.

7. The method according to claim 1, wherein the absorber layer comprises $Cu(In,Ga)Se_2$.

8. The method according to claim 1, wherein adding the at least two different alkali metals comprises separately adding the at least two different alkali metals.

9. The method according to claim 1, wherein adding the at least two different alkali metals comprises exposing the absorber layer to a vapor comprising potassium fluoride (KF) at a substrate temperature in the range of 300° C. to 400° C.

10. The method according to claim 1, wherein adding the at least two different alkali metals is performed while a vapor of at least one element selected from a group consisting of sulfur (S), selenium (Se), and tellurium (Te) is present.

11. The method according to claim 1, wherein the at least two different alkali metals further comprise sodium (Na), and adding at least two different alkali metals comprises exposing the absorber layer to sodium fluoride (NaF) and potassium fluoride (KF) in the presence of a vapor of selenium (Se).

12. The method according to claim 1, wherein the buffer layer comprises a material selected from a group consisting of cadmium sulfide (CdS), zinc oxides, zinc sulfides, Zn(O, S), indium sulfides and indium selenides, or variations thereof.

13. The method according to claim 1, further comprising forming an intermediary layer between the buffer layer and the absorber layer, wherein the intermediary layer consists essentially of one or more of potassium (K) and selenium (Se).

14. The method according to claim 1, further comprising adding at least two alkali metals to the buffer layer.

15. The method according to claim 1, further comprising forming an additional layer comprising potassium between the buffer layer and the front contact layer.

16. A method of fabricating thin-film optoelectronic devices, comprising:
    forming an absorber layer on a surface of a substrate assembly, wherein
        the substrate assembly comprises a substrate and a back-contact layer that is disposed over a surface of the substrate,
        the absorber layer comprises a chalcogenide material, and is disposed on the back-contact layer, and
        the materials used to form the substrate assembly do not contain potassium (K) or sodium (Na);
    forming a buffer layer over the absorber layer, wherein the formed buffer layer comprises an alkali metal; and
    forming a front-contact layer over the buffer layer.

17. The method according to claim 16, wherein the buffer layer comprises cadmium (Cd).

18. The method according to claim 17, wherein the alkali metal comprises potassium (K).

19. A method of fabricating thin-film optoelectronic devices, comprising:
- forming a back-contact layer over a substrate;
- forming an absorber layer over the back-contact layer, wherein the absorber layer comprises a chalcogenide material including one or more of copper, indium, and gallium;
- forming a buffer layer over the absorber layer;
- forming an intermediary layer between the absorber layer and the buffer layer, wherein the intermediary layer consists essentially of selenium (Se) and one or more alkali metals; and
- forming a front-contact layer over the buffer layer.

20. The method of claim 19, wherein forming the intermediary layer comprises a vapor deposition process of a potassium fluoride (KF).

21. The method of claim 20, wherein the vapor deposition process is performed in a presence of a selenium (Se) vapor.

* * * * *